(12) United States Patent
Inoue et al.

(10) Patent No.: US 9,508,569 B2
(45) Date of Patent: Nov. 29, 2016

(54) SUBSTRATE LIQUID PROCESSING APPARATUS

(71) Applicant: Tokyo Electron Limited, Tokyo (JP)

(72) Inventors: Shigehisa Inoue, Yokkaichi (JP); Jiro Higashijima, Kumamoto (JP); Masami Akimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/882,864

(22) Filed: Oct. 14, 2015

(65) Prior Publication Data
US 2016/0118275 A1  Apr. 28, 2016

(30) Foreign Application Priority Data
Oct. 22, 2014 (JP) ................. 2014-214944

(51) Int. Cl.
| H01L 21/67 | (2006.01) |
| B08B 3/12 | (2006.01) |
| B08B 3/04 | (2006.01) |
| B05B 15/02 | (2006.01) |
| B08B 3/02 | (2006.01) |

(52) U.S. Cl.
CPC ......... *H01L 21/67051* (2013.01); *B05B 15/02* (2013.01); *B08B 3/04* (2013.01); *B08B 3/12* (2013.01); *B08B 3/02* (2013.01)

(58) Field of Classification Search
CPC ................................. H01L 21/67051
See application file for complete search history.

(56) References Cited

U.S. PATENT DOCUMENTS

| 2003/0102017 A1 | 6/2003 | Taniyama |
| 2012/0180828 A1 | 7/2012 | Higashijima et al. |

FOREIGN PATENT DOCUMENTS

JP    2013-026369 A    2/2013

*Primary Examiner* — Jason Ko
(74) *Attorney, Agent, or Firm* — Abelman, Frayne & Schwab

(57) ABSTRACT

Disclosed is a substrate liquid processing apparatus including a substrate holding unit configured to hold a substrate; a processing liquid nozzle configured to supply a processing liquid to the substrate held by the substrate holding unit; a nozzle arm configured to hold the processing liquid nozzle; and an arm cleaning tank configured to immerse the entire surface of the nozzle arm in a cleaning liquid so as to clean the nozzle arm.

11 Claims, 16 Drawing Sheets

SUBSTRATE LIQUID PROCESSING APPARATUS

CROSS-REFERENCE TO RELATED APPLICATIONS

This application is based on and claims priority from Japanese Patent Application No. 2014-214944, filed on Oct. 22, 2014, with the Japan Patent Office, the disclosure of which is incorporated herein in its entirety by reference.

TECHNICAL FIELD

The present disclosure relates to a technique of maintaining a nozzle arm that holds a processing liquid nozzle supplying a processing liquid to a substrate, in a clean state.

BACKGROUND

When a liquid processing such as, for example, a chemical liquid processing or a rinse processing, is performed on a semiconductor wafer (hereinafter, referred to as a "wafer") that is a substrate, a processing liquid nozzle held by a nozzle arm is positioned above the wafer so as to supply a processing liquid. However, the processing liquid supplied from the processing liquid nozzle may be attached to the nozzle arm due to, for example, rebound from the wafer. When the processing liquid is dried, it may cause occurrence of particles.

Japanese Patent Laid-Open Publication No. 2013-26369 discloses a shower nozzle in which a plurality of injection holes for injecting a cleaning liquid are formed side by side along a direction where a nozzle arm extends, and injects the cleaning liquid toward the nozzle arm so as to perform cleaning (see, e.g., paragraphs 0056 to 0057 and 0081, and FIG. 3). However, it is difficult to supply the cleaning liquid to a surface of the nozzle am which does not face the ejection holes. Thus, some portion may be left uncleaned.

SUMMARY

A substrate liquid processing apparatus of the present disclosure includes a substrate holding unit configured to hold a substrate; a processing liquid nozzle configured to supply a processing liquid to the substrate held by the substrate holding unit; a nozzle arm configured to hold the processing liquid nozzle; and an arm cleaning tank configured to immerse the entire surface of the nozzle arm in a cleaning liquid so as to clean the nozzle arm.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
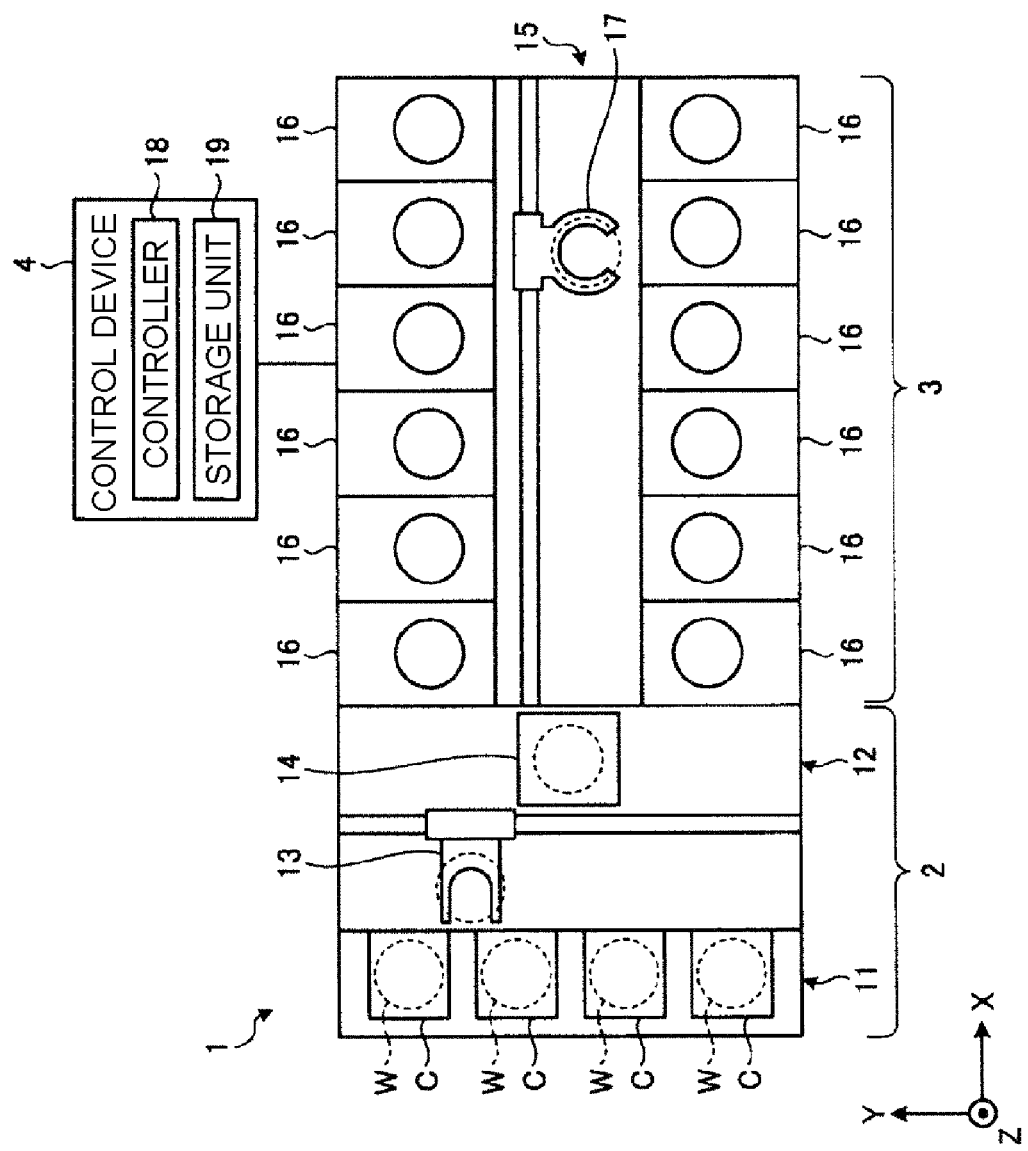
FIG. 1 is a plan view illustrating a schematic configuration of a substrate processing system including a processing unit according to an exemplary embodiment of the present disclosure.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure has been made under the circumstances described above, and is to provide a substrate liquid processing apparatus capable of maintaining a nozzle arm in a clean state.

A substrate liquid processing apparatus of the present disclosure includes a substrate holding unit configured to hold a substrate; a processing liquid nozzle configured to supply a processing liquid to the substrate held by the substrate holding unit; a nozzle arm configured to hold the processing liquid nozzle; and an arm cleaning tank configured to immerse the entire surface of the nozzle arm in a cleaning liquid so as to clean the nozzle arm.

In the substrate liquid processing apparatus described above, the nozzle arm and the processing liquid nozzle are accommodated in the arm cleaning tank at the same time, and immersed in the cleaning liquid at the same time.

In the substrate liquid processing apparatus described above, the arm cleaning tank includes a cleaning liquid supply unit configured to supply the cleaning liquid; and a cleaning liquid discharge unit configured to discharge the cleaning liquid from the arm cleaning tank.

In the substrate liquid processing apparatus described above, the nozzle arm is formed of a water-repellent material.

The substrate liquid processing apparatus described above further includes a drying liquid supply unit configured to supply a drying liquid, which is more highly volatile than the cleaning liquid, to the arm cleaning tank.

The substrate liquid processing apparatus described above further includes a driving mechanism configured to drive the nozzle arm. The driving mechanism is arranged at a lateral side of the arm cleaning tank. The nozzle arm includes a vertical bar portion that extends downwardly at a lateral side of a position where the nozzle arm is supported by the driving mechanism, and a horizontal bar that extends horizontally from a lower end of the vertical bar, so as to enable the nozzle arm to be immersed in the cleaning liquid in the arm cleaning tank.

In the substrate liquid processing apparatus described above, the arm cleaning tank is provided with a vibration unit configured to apply ultrasonic vibration to the cleaning liquid in the arm cleaning tank.

The substrate liquid processing apparatus described above further includes a temperature adjusting unit configured to adjust a temperature of the cleaning liquid.

In the substrate liquid processing apparatus described above, a liquid receiver is provided inside the arm cleaning tank to receive the processing liquid ejected from the processing liquid nozzle and discharge the processing liquid to the outside.

In the substrate liquid processing apparatus described above, a liquid receiver is provided in a bottom of the arm cleaning tank to receive the processing liquid ejected from the processing liquid nozzle and discharge the processing liquid to the outside.

The substrate liquid processing apparatus described above further includes a driving mechanism configured to drive the nozzle arm. The driving mechanism has a function to move up/down the nozzle arm, or the cleaning liquid supply unit has a function to adjust a height position of a liquid level of the cleaning liquid in the arm cleaning tank. The apparatus further comprises a controller configured to supply a control signal for controlling a height position of the nozzle arm or a height position of the liquid level between a cleaning position where the nozzle arm is immersed and cleaned in the cleaning liquid and a position where only the processing liquid nozzle is immersed in the cleaning liquid, to the driving mechanism or the cleaning liquid supply unit.

The substrate liquid processing apparatus described above further includes a cleaning liquid supply unit configured to continuously supply a cleaning liquid to the arm cleaning tank; and a drain groove installed to surround an upper end portion of the arm cleaning tank in a circumferential direction, and provided with a discharge port to receive a cleaning liquid overflowed from the arm cleaning tank and discharge the cleaning liquid.

In the substrate liquid processing apparatus described above, a discharge tank is provided below the arm cleaning tank to accommodate the cleaning liquid discharged from the arm cleaning tank. The discharge tank has a capacity larger than that of the arm cleaning tank.

In the present disclosure, since cleaning is performed by immersing the nozzle arm in the cleaning liquid within the arm cleaning tank, the entire surface of the nozzle arm may be cleaned.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the liquid processing system 1 is provided with a control device 4. The control device 4 is, for example, a computer, and includes a controller 18 and a storage unit 19. The storage unit 19 stores a program that controls various processings performed in the liquid processing system 1. The controller 18 controls the operations of the liquid processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
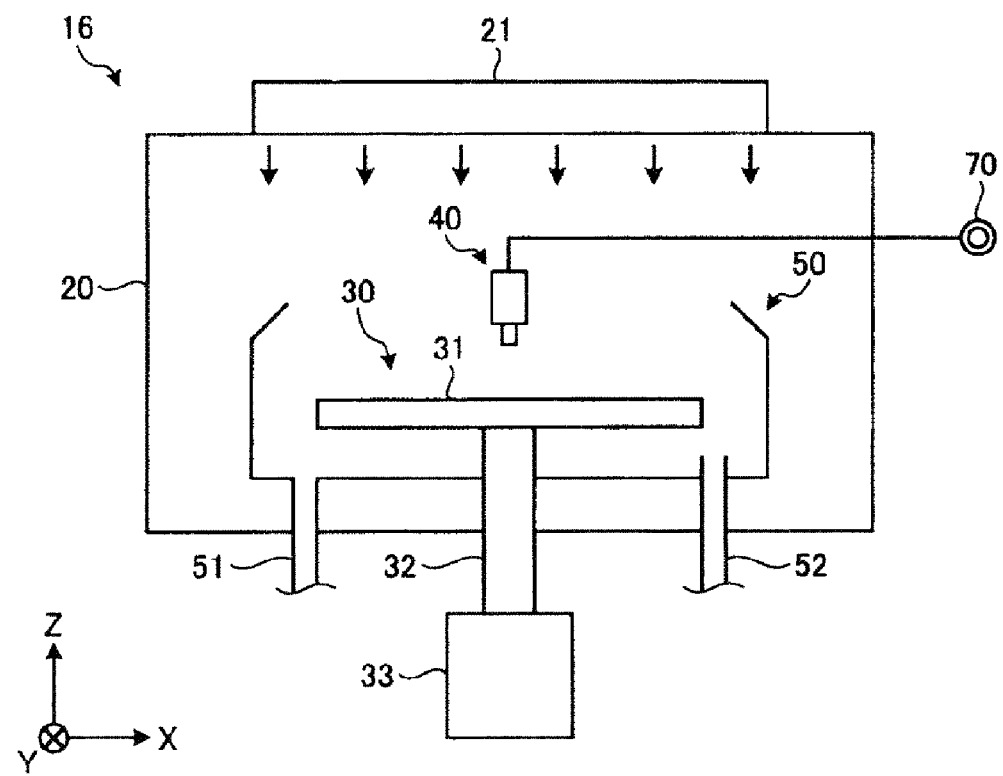
FIG. 2 is a vertical cross-sectional view illustrating a schematic configuration of the processing unit.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

The processing unit 16 outlined above includes an arm cleaning tank 23 that cleans a nozzle 41, a nozzle head 42, or an arm 43 provided in the processing fluid supply unit 40. Hereinafter, descriptions will be made on various exemplary embodiments of the processing unit 16 including the arm cleaning tank 23.

First Exemplary Embodiment

A configuration of a processing unit 16 according to a first exemplary embodiment will be described in reference to FIGS. 3 to 5.

Figure 3:
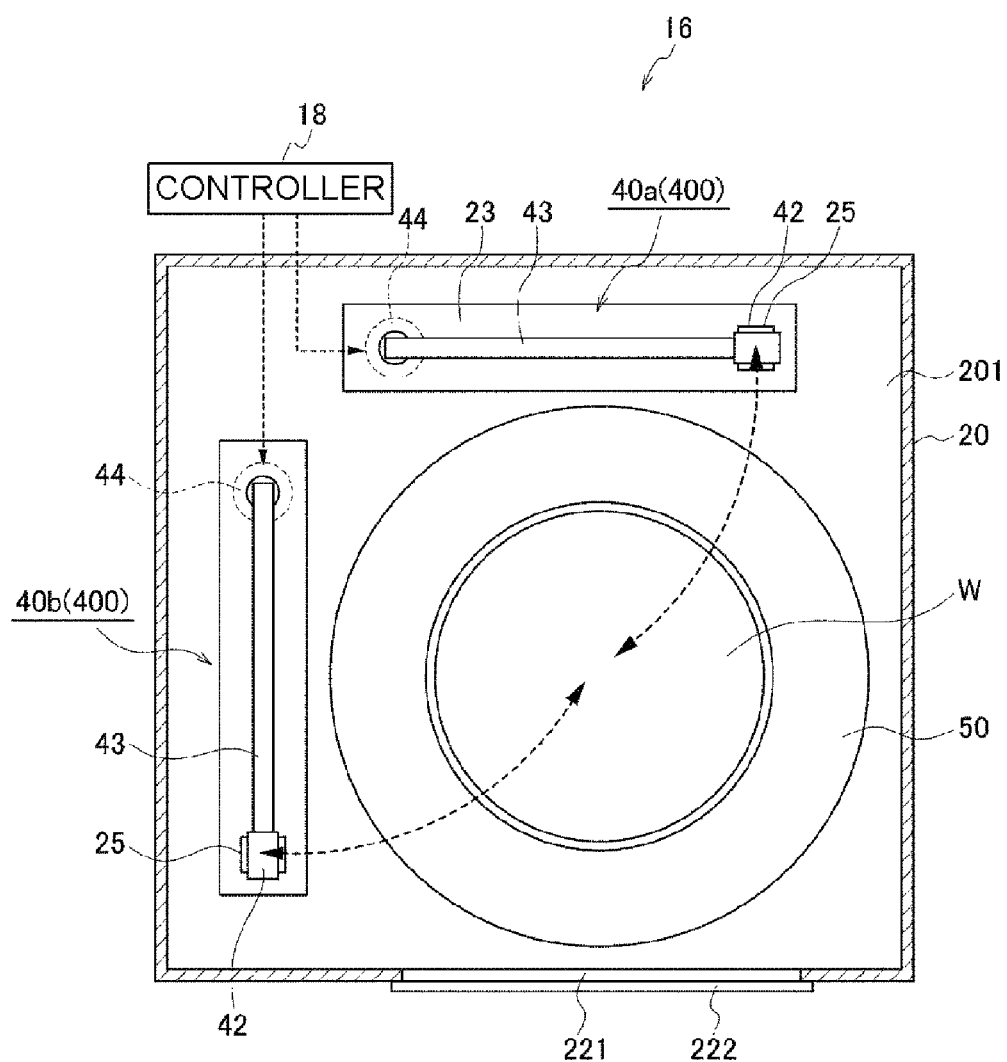
FIG. 3 is a plan view illustrating a processing unit according to a first exemplary embodiment.

As illustrated in the plan view of FIG. 3, the processing unit 16 of the present exemplary embodiment includes a plurality of (in the present exemplary embodiment, two) processing fluid supply units 40a, 40b which are configured to supply different processing liquids, respectively, to the wafer W. On a sidewall surface of the chamber 20 in which the recovery cup 50 or the processing fluid supply units 40a, 40b are accommodated, a carry-in/out port 221 of the wafer W is formed to be opened/closed by a shutter 222. The processing fluid supply unit 40a is arranged in the inside opposite to the carry-in/out port 221 across the recovery cup 50. In addition, the processing fluid supply unit 40b is arranged at the right side of the recovery cup 50 with respect to the carry-in/out port 221. Further, the processing unit 16 may be provided with a single processing fluid supply unit 40 without being limited to the case of being provided with a plurality of processing fluid supply units 40a, 40b.

Since the respective processing fluid supply units 40a, 40b include a common configuration and supply a processing liquid such as, for example, a chemical liquid or a rinse liquid, as a processing fluid, they will be collectively referred to as a processing liquid unit 400 and described together.

The processing liquid supply unit 400 includes a nozzle (processing liquid nozzle) 41 that supplies the processing liquid to the wafer W; a nozzle head 42 that holds the nozzle 41; an arm 43 extending in a horizontal direction and provided with the nozzle head 42 at its front end; and a driving unit (driving mechanism) 44 that supports a base of the arm 43 and drives the arm 43 to rotate around a vertical axis. The nozzle 41 is movable between a processing position above the wafer W and a retreat position retreated from the processing position. FIGS. 4 and 5 illustrate an example in which only one nozzle 41 is held in the nozzle head 42, but the nozzle head 42 may hold a plurality of nozzles 41 that supply different processing liquids, respectively. The nozzle head 42 and the arm 43 constitute a nozzle arm of the present exemplary embodiment. The nozzle 41 or the nozzle head 42, and the arm 43 are made of a water-repellent material such as, for example, a fluororesin.

Figure 4:
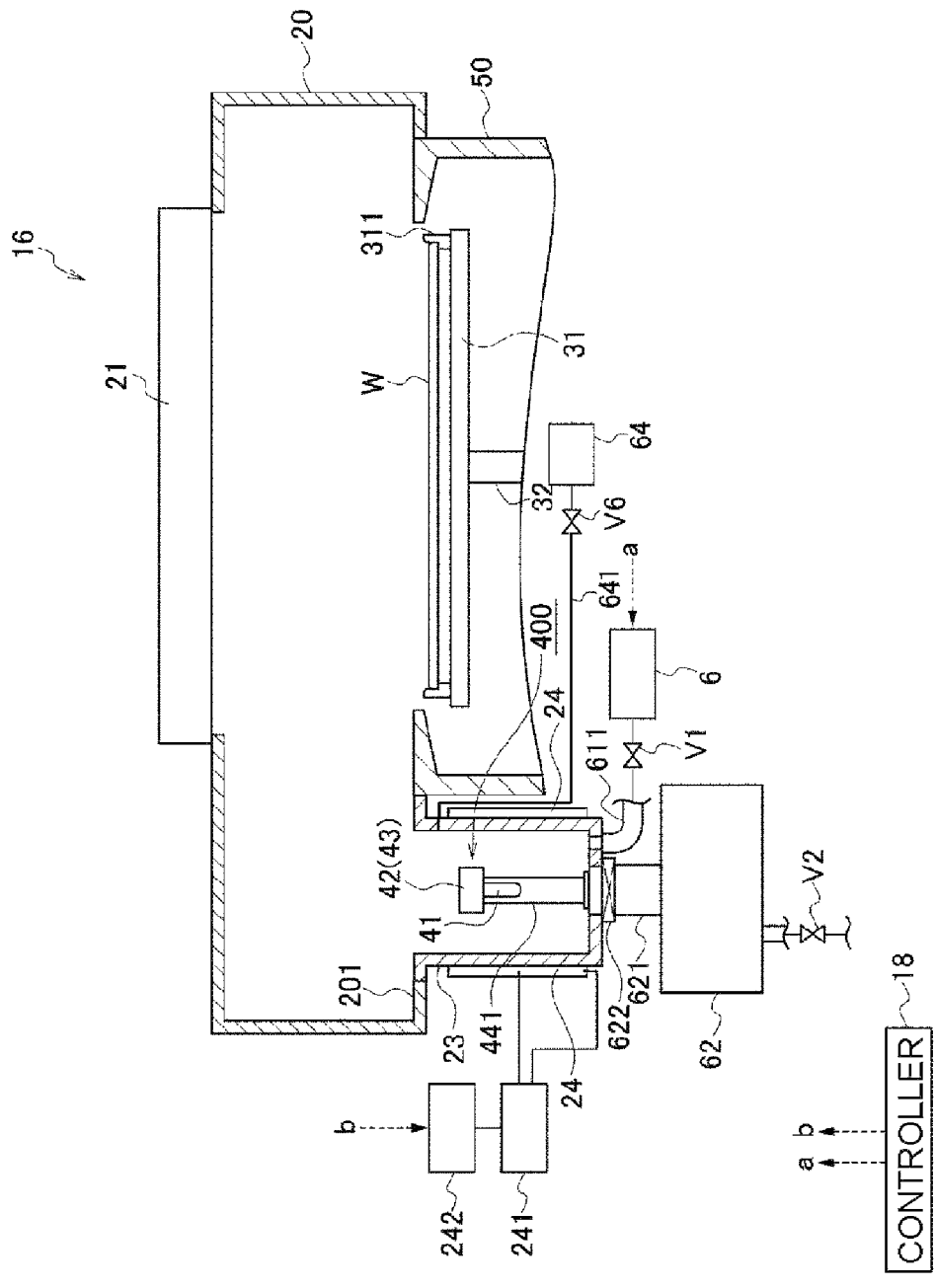
FIG. 4 is a vertical cross-sectional view of the processing unit.

In the bottom surface 201 of the chamber 20 at a position where the processing liquid supply unit 400 is arranged, the arm cleaning tank 23 is opened in which the cleaning of the nozzle 41 or the nozzle head 42 and the arm 43 is performed (see FIG. 4). The arm cleaning tank 23 is provided to form a concave portion from the opening toward a downward side. A cleaning liquid for cleaning the nozzle 41 or the like is stored in the concave portion.

In the processing liquid supply unit 400, the driving unit 44 is arranged to project downwardly from the bottom surface of the concave portion that constitutes the arm cleaning tank 23. When the nozzle 41 is retreated to the retreat position, the whole processing liquid supply unit 400 including the nozzle 41, the nozzle head 42, and the arm 43, and a support 441 supporting the arm 43 are accommodated in the arm cleaning tank 23 (see FIGS. 3, 4, and 5).

Further, the driving unit 44 has a function to move up/down the arm 43 between a height position (cleaning position) where the nozzle 41, the nozzle head 42, and the arm 43 are accommodated in the arm cleaning tank 23 and a position above the cleaning position by expanding/contracting the support 441, in addition to a function to rotate the arm 43 around the vertical axis. In the present exemplary embodiment, the cleaning position also serves as the retreat position of the nozzle 41 retreated from the processing position. Here, the position above the cleaning position means a height position required for moving the nozzle 41 to the processing position. Further, the extendible support 441, or the connecting portion of the driving unit 44 and the support 441 is formed in a waterproof structure.

Figure 5:
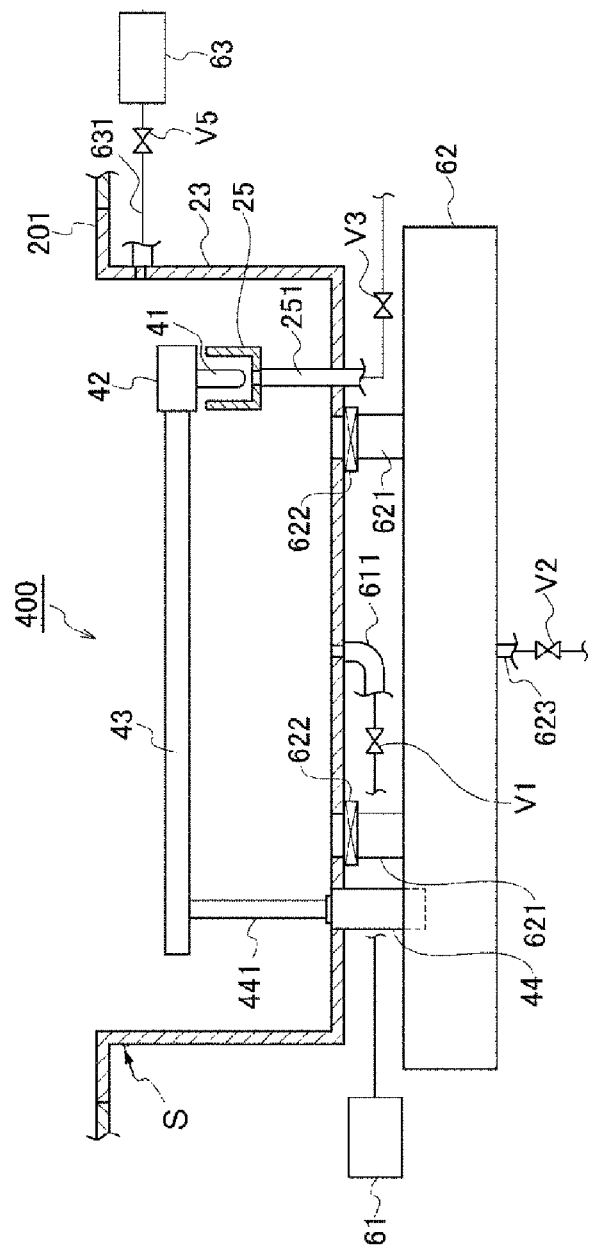
FIG. 5 is a vertical cross-sectional view illustrating an arm cleaning tank provided in the processing unit.
Figure 6:
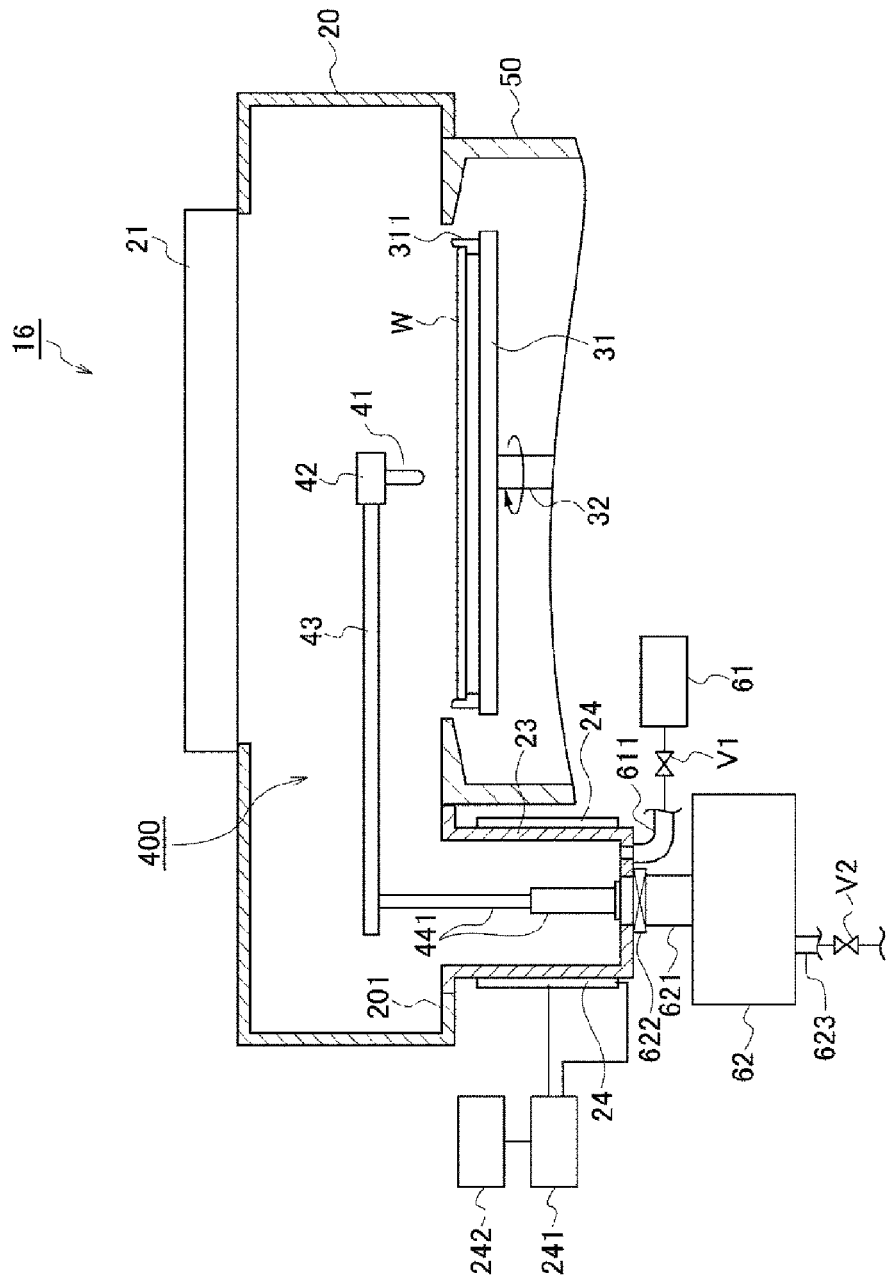
FIG. 6 is a vertical cross-sectional view illustrating the processing unit during a liquid processing.

As illustrated in FIGS. 4 and 5, for example, a lower surface of the arm cleaning tank 23 is connected with a cleaning liquid supply pipe 611 that supplies the cleaning liquid into the arm cleaning tank 23. The upstream side of the cleaning liquid supply pipe 611 is connected to a cleaning liquid supply unit 61 via an opening/closing valve V1. The cleaning liquid supply unit 61 includes a storage tank that stores deionized water (DIW) serving as a cleaning liquid for cleaning the nozzle 41 or the like, a cleaning liquid delivery pump, a liquid level meter that measures a liquid amount of the cleaning liquid delivered from the cleaning liquid supply unit 61 to the arm cleaning tank 23, or a temperature adjusting unit that adjusts the temperature of the cleaning liquid, all of which are not illustrated. The arm cleaning tank 23 is connected to a drying liquid supply pipe 631 that supplies a drying liquid into the arm cleaning tank 23. The upstream side of the drying liquid supply pipe 631 is connected to a drying liquid supply unit 63 via an opening/closing valve V5. The drying liquid supply unit 63 includes a storage tank that stores isopropyl alcohol (IPA)

serving as a drying liquid, which is more highly volatile than the cleaning liquid, in order to facilitate drying after the nozzle 41 and the like are cleaned, a drying liquid delivery pump, or a temperature adjusting unit that adjusts the temperature of the drying liquid, all of which are not illustrated. Further, the arm cleaning tank 23 includes a liquid level detector S that detects the liquid level of the cleaning liquid or the drying liquid supplied into the arm cleaning tank 23. Further, the arm cleaning tank 23 is connected with a drying gas supply pipe 641 that supplies a drying gas into the arm cleaning tank 23. The upstream side of the drying gas supply pipe 641 is connected to a drying gas supply unit 64 via an opening/closing valve V6. In a case where IPA is used as the cleaning liquid or a case where the drying liquid or the drying gas is unnecessary for drying of the processing liquid supply unit 400, the drying liquid supply unit 63 and the drying gas supply unit 64 may not be provided.

Further, the arm cleaning tank 23 is provided with, for example, two discharge pipes 621 that discharge the cleaning liquid in the arm cleaning tank 23. The discharge pipes 621 are connected to the lower surface of the arm cleaning tank 23 via opening/closing valves 622 such as for example, slide valves, and extend downwardly, respectively. The discharge pipes 621 are constituted with large diameter piping members, as compared with the cleaning liquid supply pipe 611, and are able to discharge the cleaning liquid in the arm cleaning tank 23 in a short time. A common discharge tank 62 is provided below the arm cleaning tank 23 to accommodate the cleaning liquid discharged from the arm cleaning tank 23.

The discharge tank 62 has a capacity larger than that of the arm cleaning tank 23 so as to accommodate the entire amount of the cleaning liquid in the arm cleaning tank 23. A lower surface of the discharge tank 62 is connected with a drain pipe 623 that discharges the cleaning liquid in the discharge tank 62 to the outside. The drain pipe 623 is provided with an opening/closing valve V2 that is opened when the cleaning liquid is discharged from the discharge tank 62. Further, when the driving unit 44 protruding downwardly from the bottom surface of the arm cleaning tank 23 interferes with the discharge tank 62, a recess for inserting the driving unit 44 may be provided on the upper surface of the discharge tank 62.

Further, the arm cleaning tank 23 is provided with a liquid receiver 25 that receives the processing liquid ejected from the nozzle 41 when a dummy dispense is performed to eject the processing liquid in the nozzle 41 while the nozzle 41 is positioned at the retreat position. The liquid receiver 25 has a container shape with its upper surface side opened, and is arranged at a position where the nozzle is inserted into the liquid receive 25 when the nozzle 41 is moved up to the retreat position (cleaning position). An opening/closing valve V3 is interposed in the bottom surface of the liquid receiver 25, and connected with a discharge pipe 251 that discharges the processing liquid ejected from the nozzle 41 to the outside. For the convenience of illustration, illustration of the liquid receiver 25 is omitted in drawings other than FIGS. 3 and 5.

Further, as illustrated in FIG. 4, a vibration unit 24 is provided on an outer wall surface of the arm cleaning tank 23 to apply ultrasonic vibration (hereinafter, referred to as "to apply ultrasonic waves") to the cleaning liquid in the arm cleaning tank 23 so as to facilitate the cleaning of the nozzle 41. The vibration unit 24 includes a vibrator (not illustrated) and applies ultrasonic waves to the cleaning liquid by vibrating the vibrator by a high frequency power supplied from an oscillating unit 241. The oscillating unit 241 is supplied with a power from a power feeding unit 242.

The driving unit 44, the cleaning liquid supply unit 61, the power feeding unit 242, and the respective valves V1 to V3, 622 of the processing liquid supply unit 400 as described above perform respective operations according to a control signal from the controller 18 described above.

Hereinafter, actions of the processing unit 16 according to the first exemplary embodiment will be described with reference to FIGS. 3 to 7.

A wafer W, which is an object to be processed, is transferred into the transfer section 15 by the substrate transfer device 17, carried into a processing unit 16 which performs a processing of the wafer W, through the carry-in/out port 221, and then, delivered to a holding pin 311 on the holding unit 31, which is a substrate holding unit. When the substrate transfer device 17 is retreated from the processing unit 16 after delivering the wafer W, the carry-in/out port 221 is closed by the shutter 222.

Subsequently, based on a predetermined order, one of the processing fluid supply units 40a, 40b (processing liquid supply unit 400) is moved from the retreat position to the processing unit. Specifically, as illustrated in FIGS. 4 and 5, the nozzle is retreated to the retreat position in the arm cleaning tank 23 in an empty state where the cleaning liquid is not supplied. At a timing of supplying the processing liquid to the wafer W, the arm 43 is moved up to the upper side of the retreat position by the driving unit 44, and the entire processing liquid supply unit 400 (including the nozzle 41, the nozzle head 42, and the arm 43) is moved into the chamber 20 through the opening of the arm cleaning tank 23. Subsequently, the nozzle 41 is moved to the processing position above the central portion of the wafer W held by the holding unit 31, by the driving unit 44 (see FIG. 6). Further, for example, before a processing of a wafer W in a new lot is started, the movement of the nozzle 41 may be started after a dummy dispense is performed to eject the processing liquid from the nozzle 41 to the liquid receiver 25.

Thereafter, the wafer W is rotated around the vertical axis at a predetermined rotation speed, the processing liquid such as, for example, a chemical liquid is supplied from the nozzle 41, and the chemical liquid is diffused on the surface of the rotating wafer W, thereby performing the processing of the wafer W. Then, after the chemical liquid is supplied for a predetermined period of time, the processing liquid to be supplied to the wafer W is switched to a rinse liquid such as, for example, DIW, so as to perform a rinsing of the wafer W.

After the rinsing is performed, one of the processing fluid supply units 40a, 40b (the processing liquid supply unit 400), to which the processing has been first supplied, is retreated to the retreat position. Then, the other one of the processing fluid supply units 40a, 40b is moved from the retreat position to the processing position in the same order, and the processing liquid is supplied from the nozzle 41 so as to perform a liquid processing of the wafer W. Thereafter, the other one of the processing fluid supply units 40a, 40b is retreated to the retreat position, the rotation of the wafer W is stopped, and then, the external substrate transfer device 17 enters to carry out the wafer W.

Thus, the liquid processing is sequentially performed on a plurality of wafers W using the processing liquid supply unit 400 (the processing fluid supply units 40a, 40b), and the nozzle 41 of each processing liquid supply unit 400 is repeatedly moved between the retreat position and the processing position.

Then, the processing liquid supply unit 400 (including the nozzle 41, the nozzle head 42, and the arm 43) is cleaned, for example, at a timing when a processing has been performed on a predetermined number of wafers W, or at a timing when a predetermined time has elapsed from the last cleaning.

When the processing liquid supply unit 400 is cleaned, the nozzle 41 is stopped at a cleaning position in the arm cleaning tank 23 illustrated in FIGS. 4 and 5 (that is also the retreat position described above), and all of the nozzle 41, the nozzle head 42, and the arm 43 are accommodated in the arm cleaning tank 23. Further, the processing liquid supply unit 400 may be cleaned after the processing liquid inside the nozzle 41 or within the pipe provided in the arm 43 is recovered by returning to a recovery pipe side (not illustrated) at the upstream side, and the nozzle 41 or the inside of the processing liquid supply pipe to be immersed in the cleaning liquid is emptied out.

Figure 7:
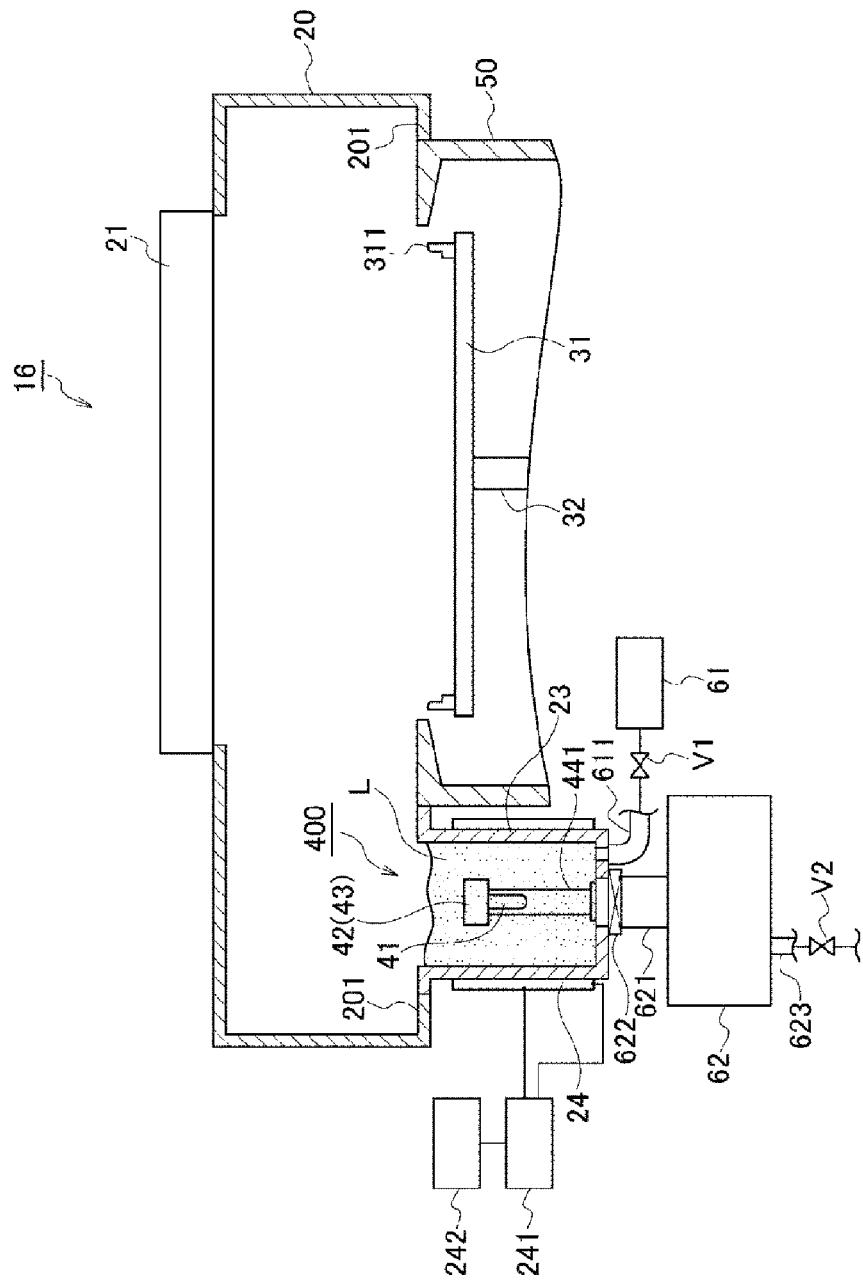
FIG. 7 is a vertical cross-sectional view illustrating the processing unit during the cleaning of a processing liquid supply unit.

When preparations of cleaning the processing liquid supply unit 400 is completed, the opening/closing valve V1 of the cleaning liquid supply pipe 611 is opened while the opening/closing valves 622 of the discharge pipes 621 and the opening/closing valve V3 of the discharge pipe 251 are closed, and a predetermined amount of the cleaning liquid is supplied from the cleaning liquid supply unit 61 to the arm cleaning tank 23. The amount of the cleaning liquid supplied from the cleaning liquid supply unit 61 to the arm cleaning tank 23 is set to the extent that all of the nozzle 41, the nozzle head 42, and the arm 43 are immersed in the cleaning liquid L while the cleaning liquid L does not overflow from the arm cleaning tank 23, as illustrated in FIG. 7. Further, the liquid level may be controlled by the liquid level detector S.

When the supply of the cleaning liquid L is completed, the oscillating unit 241 is operated so as to apply ultrasonic waves from the vibration unit 24 to the cleaning liquid L in the arm cleaning tank 23, so that the cleaning of the processing liquid supply unit 400 is performed. As a result, any contaminants due to the processing liquid, which are attached to the surface of the nozzle 41, the nozzle head 42, or the arm 43, are removed.

When the processing liquid supply unit 400 is cleaned for a predetermined period of time, the application of the ultrasonic waves from the vibration unit 24 is stopped, and the opening/closing valves 622 of the two discharge pipes 621 are opened, so that the cleaning liquid L in the arm cleaning tank 23 is discharged toward the discharge tank 62. In this case, the time taken to resume the liquid processing of the wafer W may be shortened by reducing the time required for the discharge of the cleaning liquid L using a plurality of discharge pipes 621 each having a relatively large diameter. As described above, the cleaning liquid L may be discharged within a short time. However, since an excessively rapid discharge tends to leave liquid droplets, the liquid level may descend slowly at a speed that makes the liquid droplets hard to stay. Therefore, the opening degree of the opening/closing valves 622 may be adapted to be controllable. Further, since a water-repellent material is used for the nozzle head 42 and the arm 43, the liquid droplets of the cleaning liquid L may be discharged without remaining on the surfaces of the nozzle head 42 and the arm 43. As a result, the liquid droplets of the cleaning liquid L may be suppressed from being crystallized by drying, which causes particles. The cleaning liquid L discharged from the arm cleaning tank 23 is accommodated in the discharge tank 62, and separately discharged through the drain pipe 623. In addition, the cleaning liquid L entering into the liquid receiver 25 is also discharged to the outside by opening the opening/closing valve V3 of the discharge pipe 251. Thus, a series of cleaning processing of the processing liquid supply unit 400 is completed.

When the cleaning liquid L is discharged from the arm cleaning tank 23, the opening/closing valves 622 are closed and the processing liquid supply unit 400 is placed in the state where the use of the processing liquid supply may be resumed.

Here, the arm cleaning tank 23 may be constituted with a water-repellant member such as, for example, a fluororesin, such that the cleaning liquid L is rapidly removed from the inner surface of the arm cleaning tank 23. Further, the opening/closing valve V6 may be opened to inject a drying gas from the drying gas supply unit 64 to the nozzle 41, the nozzle head 42, and the arm 43 so as to dry the surfaces thereof. The drying gas may be an inert gas such as, for example, nitrogen, or a dehumidified air. Further, a series of cleaning processings of the processing liquid supply unit 400 may be repeatedly performed.

For example, in a case where a processing liquid, which has been controlled to a preset temperature from a state where the processing liquid was not supplied from the processing liquid supply unit 400 for a long period of time, is supplied, a dummy dispense may be performed so as to discard a predetermined amount of the processing liquid, and then, warming-up of the processing liquid supply unit 400 may be performed. Instead of, or in addition to this operation, the temperature of the cleaning liquid L supplied to the arm cleaning tank 23 may be controlled to the preset temperature by using a temperature controller provided in the processing liquid supply unit 61. Therefore, the warming-up of the processing liquid supply unit 400 is performed in parallel with the cleaning. Thus, since the processing liquid controlled to the preset temperature is able to be supplied to the wafer W after the cleaning is completed, the processing of the wafer W may be immediately started without performing the dummy dispense or with a small number of times of the dummy dispense. Further, the consumption of the processing liquid may be reduced as compared with the case of performing the dummy dispense only. Further, the temperature control of the cleaning liquid L may be performed by, for example, a heater provided in the arm cleaning tank 23.

In the exemplary embodiment described above, descriptions have been made on a case where the retreat position of the nozzle 41 and the cleaning position of the processing liquid supply unit 400 are coincident, but these positions are not necessarily coincident.

Second Exemplary Embodiment

Descriptions will be made on a processing unit 16a (16) according to a second exemplary embodiment in which a driving unit 44a is provided above the arm cleaning tank 23, in reference to FIGS. 8 to 12.

In FIGS. 8 to 15, which are used for the following descriptions of various exemplary embodiments, components in common with the processing unit 16 according to the first exemplary embodiment described in reference to FIGS. 3 to 7, are denoted by the same reference numerals as those used in the drawings.

Figure 8:
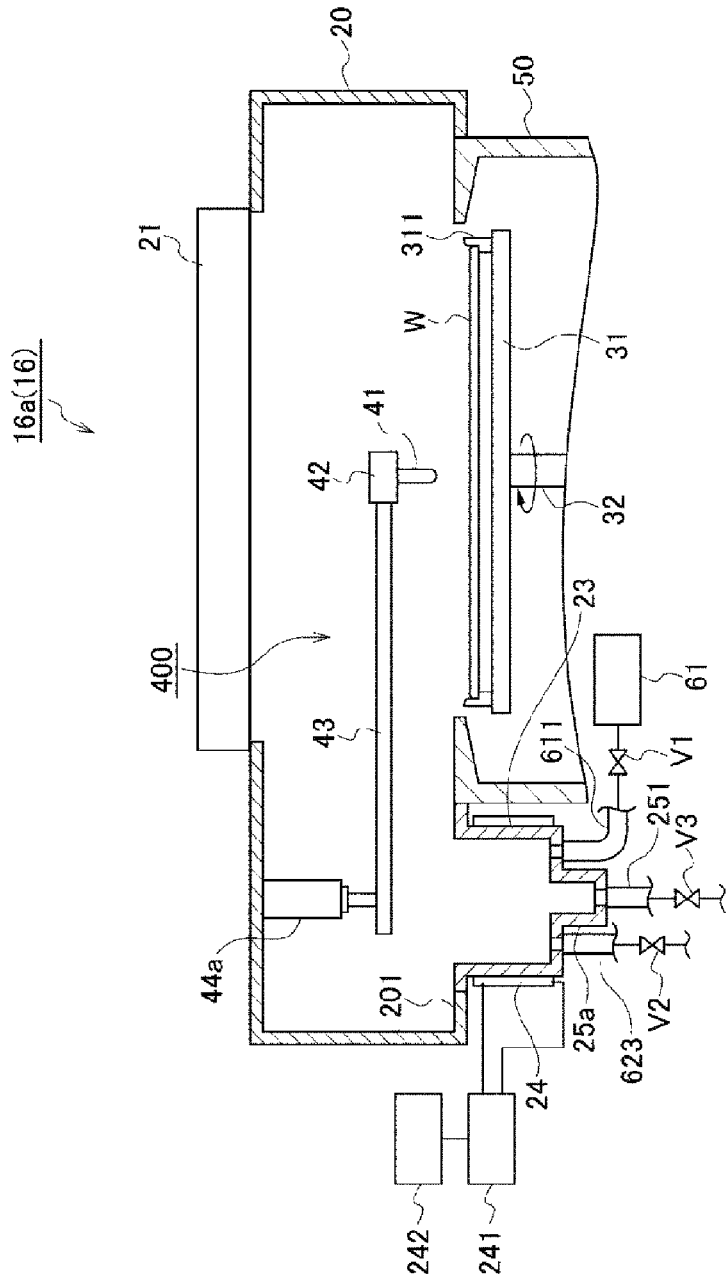
FIG. 8 is a vertical cross-sectional view illustrating a processing unit according to a second exemplary embodiment.

As illustrated in FIG. 8, the processing unit 16a of the present exemplary embodiment is different from the processing unit 16 according to the first exemplary embodiment in which the driving unit 44 is provided below the arm cleaning tank 23, in that the driving unit 44a of the processing liquid supply unit 400 is arranged on the ceiling of the chamber 20. As a result, the driving unit 44a is provided at a position above the opening of the arm cleaning tank 23, and the base end of the arm 43 is held from the upper surface side by the driving unit 44a.

Figure 9:
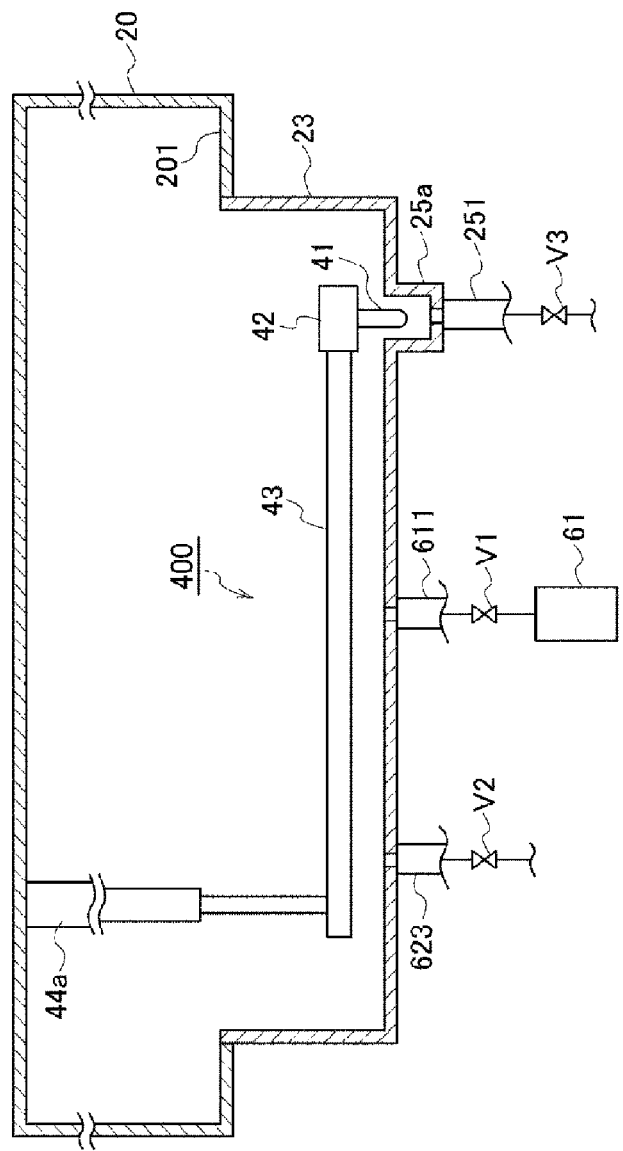
FIG. 9 is a vertical cross-sectional view illustrating an arm cleaning tank during a dummy dispense.

Further, as illustrated in FIGS. 8 and 9, the present exemplary embodiment is different from the first exemplary embodiment in which the liquid receiver 25 is arranged in the space of the arm cleaning tank 23, in that a liquid receiver 25a for a dummy dispense of the nozzle 41 is provided on the bottom surface of the arm cleaning tank 23. Further, in the present exemplary embodiment, a height dimension of the arm cleaning tank 23 is low, as compared with the first exemplary embodiment. As a result, since the storage amount of the cleaning liquid L in the arm cleaning tank 23 is small, the discharge of the cleaning liquid L is performed using a single drain pipe 623 having a diameter smaller than that of the discharge pipe 621.

Further, in the processing unit 16a of the present exemplary embodiment, the height position of the liquid level of the cleaning liquid L in the arm cleaning tank 23 may be changed by controlling the supply amount of the cleaning liquid L from the cleaning liquid supply unit 61.

The actions of the processing unit 16a having the above-described configuration will be described. For example, it is assumed that, as illustrated in FIG. 9, a position where the nozzle 41 is inserted into the liquid receiver 25a provided on the bottom surface of the arm cleaning tank 23, is set as the retreat position.

In this case, the processing unit 16a of the present exemplary embodiment is similar to the processing unit 16 of the first exemplary embodiment, in that the liquid processing of the wafer W is performed by supplying a processing liquid to the rotating wafer W while the nozzle 41 is moved between the retreat position (FIG. 9) and the processing position (FIG. 8), and in that the dummy dispense of the nozzle 41 is performed toward the liquid receiver 25a at a predetermined timing.

Meanwhile, the nozzle 41 performing the supply of the processing liquid is apt to be contaminated by the processing liquid, as compared with the arm 43. Therefore, even if it is necessary to clean the nozzle 41, contamination may not occur in the nozzle head 42 or the arm 43 in some cases. In such cases, if the whole of the processing liquid supply unit 400 (including the nozzle 41, the nozzle head 42, and the arm 43) is immersed in the cleaning liquid L to perform the cleaning even in such a case, the consumption of the cleaning liquid L will be increased.

Accordingly, in the processing unit 16a of the present exemplary embodiment, the height position of the liquid level of the cleaning liquid L in the arm cleaning tank 23 is changed by controlling the amount of the cleaning liquid L supplied from the cleaning liquid supply unit 61, so as to perform switching between a mode for cleaning only the nozzle 41 and a mode for cleaning the processing liquid supply unit 400.

Figure 10:
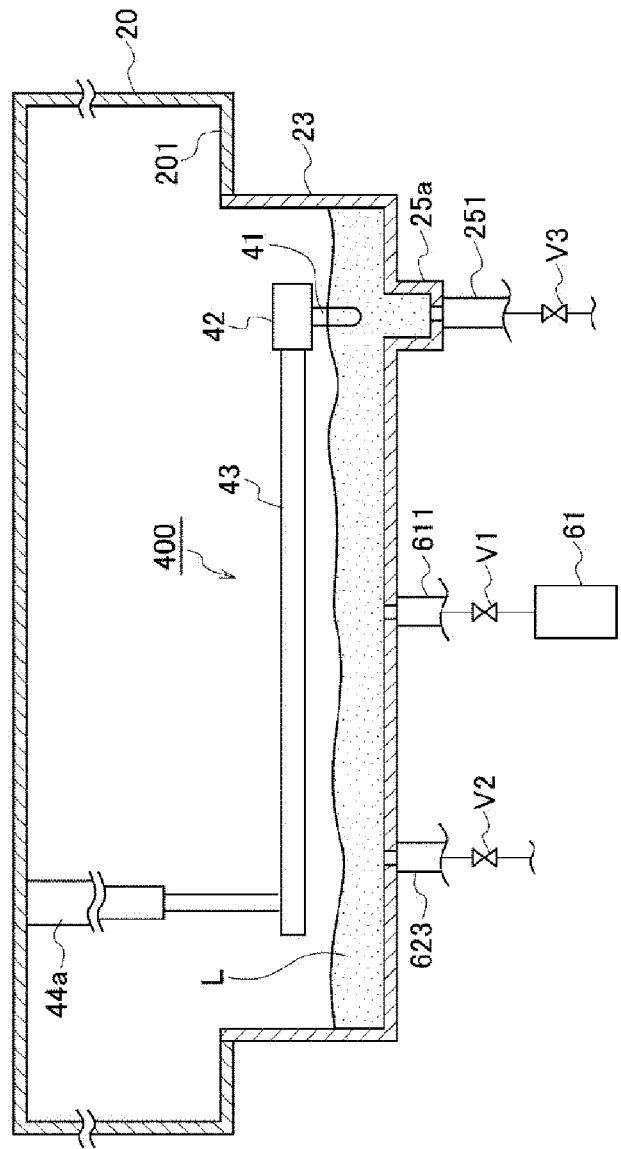
FIG. 10 is a vertical cross-sectional view illustrating an arm cleaning tank during a nozzle cleaning.
Figure 11:
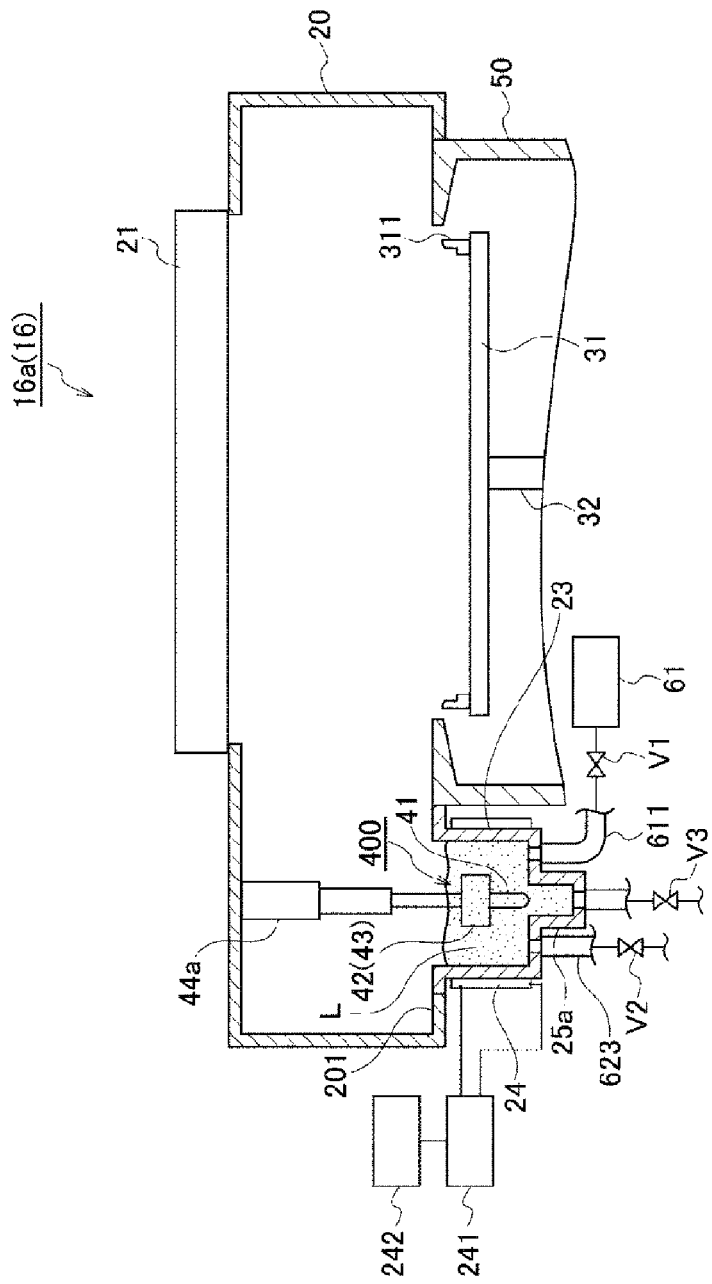
FIG. 11 is a vertical cross-sectional view illustrating the processing unit during the cleaning of a processing liquid supply unit.
Figure 12:
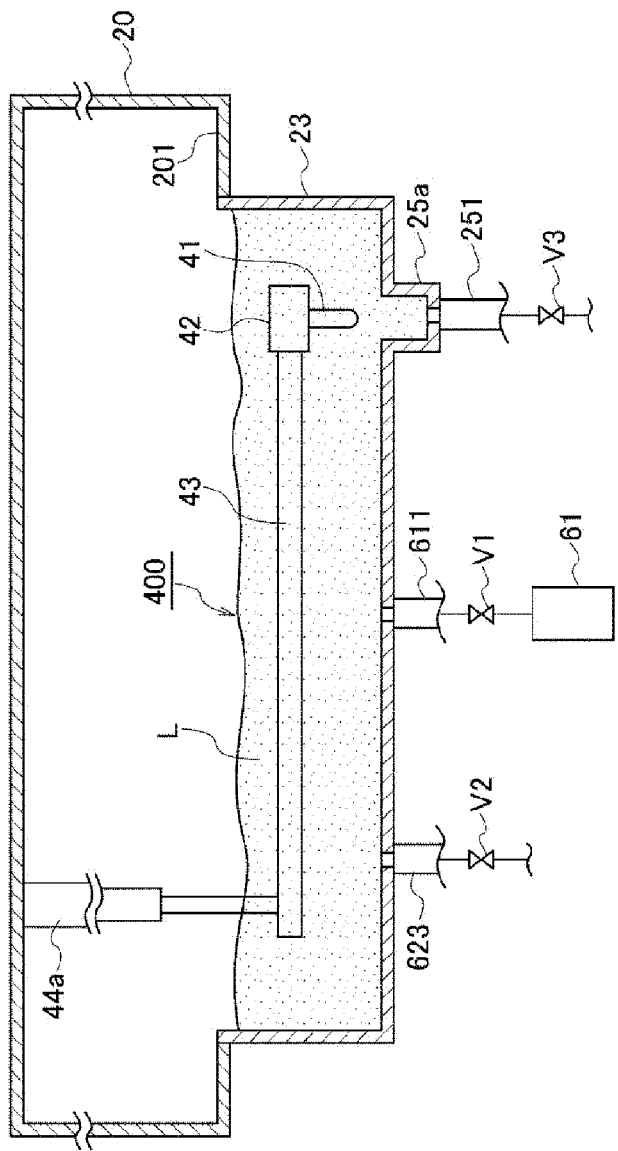
FIG. 12 is a vertical cross-sectional view illustrating the arm cleaning tank during the cleaning of the processing liquid supply unit.

For example, as illustrated in FIGS. 10 and 12, a position where the nozzle 41 is withdrawn from the liquid receiver 25a, is set as the cleaning position. In this case, in the mode for cleaning only the nozzle 41, the supply amount of the cleaning liquid L from the processing liquid supply unit 61 is controlled such that only the nozzle 41 is immersed in the cleaning liquid L (see FIG. 10). Meanwhile, in the mode for cleaning the processing liquid supply unit 400, the supply amount of the cleaning liquid L is increased up to a position where all of the nozzle 41, the nozzle head 42, and the arm 43 are immersed in the cleaning liquid L (see FIGS. 11 and 12).

In each mode, the processing unit 16a of the present exemplary embodiment is similar to the processing unit 16 according to the first exemplary embodiment, in that the cleaning is performed by operating the vibration unit 24 to apply ultrasonic waves to the cleaning liquid L, and in that the cleaning liquid L in the arm cleaning tank 23 is discharged after the cleaning is completed.

Further, the switching between the mode for cleaning only nozzle 41 and the mode for cleaning the processing liquid supply unit 400 is not limited to the method of changing the height position of the liquid level in the arm cleaning tank 23. For example, the cleaning liquid L is supplied to the arm cleaning tank 23 up to a height position where the cleaning of the processing liquid supply unit 400 is capable of being performed (see FIGS. 11 and 12), the height of the arm 43 held by the driving unit 44a may be changed between the height position where only the nozzle 41 is immersed in the cleaning liquid L and the height position where the nozzle 41, the nozzle head 42, and the arm 43 are immersed. However, as described above in reference to FIG. 10, changing the supply amount of the cleaning liquid L may bring an effect to reduce the consumption of the cleaning liquid.

Third Exemplary Embodiment

Subsequently, FIGS. 13 to 16 illustrate a processing unit 16b (16) according to a third exemplary embodiment.

The processing unit 16b of the present exemplary embodiment is different from the processing unit 16 according to the first exemplary embodiment in which the driving unit 44 is provided below the vibration unit 24, in that a driving unit 44b of the processing liquid supply unit 400 is arranged on the bottom surface 201 of the chamber 20, which is outside the arm cleaning tank 23 (see FIGS. 13 and 14). For example, the driving unit 44b is arranged on the bottom surface 201 in a lateral position of the opening of the arm cleaning tank 23.

Figure 16:
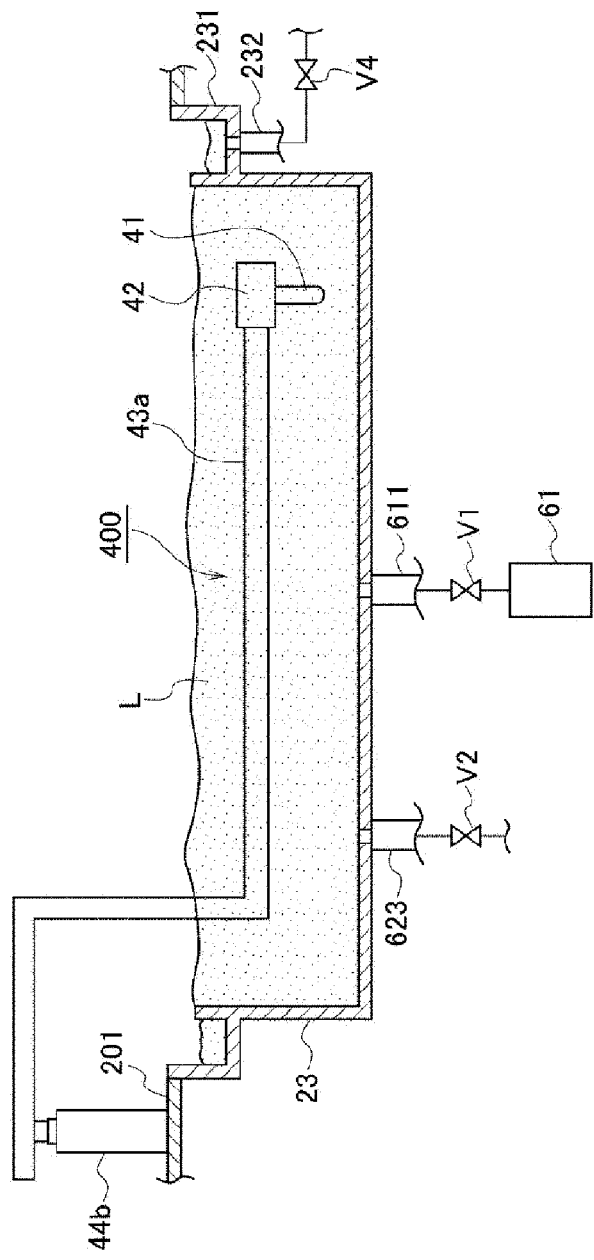
FIG. 16 is a vertical cross-sectional view illustrating the arm cleaning tank during the cleaning of the processing liquid supply unit.

The driving unit 44b is arranged so as to extend upwardly from the bottom surface 201. The arm 43a is supported from its lower surface in the upper end portion of the driving unit 44b. And, as illustrated in FIGS. 13 and 16, the arm 43a, when viewed from the side, includes a vertical bar portion that extends downwardly at a lateral side of a position supported by the driving unit 44b, and a horizontal bar that extends horizontally from a lower end of the vertical bar, in a stepwise shape. When the driving unit 44b moves the arm 43a down to the cleaning position, the horizontal bar portion of the arm 43a, the nozzle head 42, and the nozzle 41 are immersed in the cleaning liquid L (see FIG. 16).

Further, the processing unit 16b of the present exemplary embodiment performs a processing of the wafer W in a state where the arm cleaning tank 23 is always filled with the cleaning liquid L. A discharge groove 231 is formed around the opening of the arm cleaning tank 23 to surround the outer side of the opening in the circumferential direction. And, a predetermined amount of the cleaning liquid L is continuously supplied from the cleaning liquid supply unit 61 to the arm cleaning tank 23, and the cleaning liquid L in the arm cleaning tank 23 overflows from the upper end of the sidewall of the arm cleaning tank 23 toward the inside of the discharge groove 231.

The cleaning liquid L flowing into the discharge groove 231 is discharged toward a drain pipe 232 connected to the bottom surface of the discharge groove 231. The drain pipe 232 is provided with an opening/closing valve V4. The drain pipe 232 is normally opened so that the cleaning liquid L flowing into the discharge groove 231 is continuously discharged from the drain pipe 232 (see FIG. 14). As a result, supply of a new cleaning liquid L and discharge of the cleaning liquid L overflowing from the arm cleaning tank 23 are continuously performed so that the cleaning liquid L is maintained in a less contaminated state.

The opening of the drain pipe 232 at a connecting position with the discharge groove 231 corresponds to a discharge port of the discharge groove 231. For the convenience of illustration, illustration of the drain 232 is omitted in drawings other than FIGS. 14 and 16.

In the processing unit 16b of the present exemplary embodiment, which has the above-described configuration, the retreat position is set to a position where the nozzle 41, the nozzle head 42, and the horizontal bar portion at the front end side of the arm 43a are immersed in the cleaning liquid L. That is, in the processing unit 16b, the retreat position of the nozzle 41 also serves as the cleaning position of the processing liquid supply unit 400 such that the cleaning of the processing liquid supply unit 400 is performed whenever the nozzle 41 is retreated to the retreat position.

For the cleaning performed when the nozzle 41 is retreated to the retreat position, ultrasonic waves may be always applied from the vibration unit 24. Alternatively, ultrasonic waves may be applied at a timing, for example, after a predetermined sheets of wafers W are processed.

In a case where the driving unit 44b is provided on the bottom surface 201, a part of the vertical bar portion present at the base end side of the arm 43a is not immersed in the cleaning liquid L. However, since the part is far from the nozzle 41 where the supply of the processing liquid is performed, the part is located in a region which is low in concern of contamination occurrence and is positioned far away from the wafer W which is an object to be processed. Therefore, even though the processing liquid is attached thereto, the attached matter hardly causes the contamination of the wafer W.

When the processing of the wafer W is performed in a state where the nozzle 41 is retreated to the retreat position in the cleaning liquid L, the nozzle 41 is slowly raised above the arm cleaning tank 23 at a speed where no liquid droplet remains on the surfaces of the nozzle 41, the nozzle head 42, or the arm 43a, and then, moved to the processing position. In this case, an inclined surface that is lowered gradually from the inside to the outside may be formed on the upper surface of the nozzle head 42 or the upper surface of the arm 43a such that no liquid droplet remains on the upper surfaces of the nozzle head 42 and the arm 43a.

When the dummy dispense of the nozzle 41 is performed, the processing liquid may be ejected toward the cleaning liquid L in the arm cleaning tank 23.

Here, for the cleaning liquid L in the arm cleaning tank 23, it is not necessary to employ a method of normally supplying a new cleaning liquid L from the cleaning liquid supply unit 61. For example, the cleaning liquid L in the arm cleaning tank 23 may be replaced whenever a predetermined number of wafers W are processed, or at a timing when a predetermined period of time has elapsed. In this case, the discharge groove 231 that receives the cleaning liquid overflowing from the upper end of the arm cleaning tank 23 may not be formed.

Even in a case where the cleaning liquid L is continuously supplied from the cleaning liquid supply unit 61, it is not necessary to form the discharge groove 231 in the arm cleaning tank 23. The cleaning liquid L in the arm cleaning tank 23 may be discharged from the drain pipe 623 connected to the arm cleaning tank 23 while the cleaning liquid L is supplied from the cleaning liquid supply unit 61.

The processing units 16, 16a, 16b according to the first to third exemplary embodiments described above, have the following effects. Since the cleaning is performed by immersing the nozzle 41, the nozzle head 42, and the arms 43, 43a (i.e., the nozzle arms) in the cleaning liquid L of the arm cleaning tank 23, the entire surfaces of the members may be cleaned while suppressing contamination of the chamber 20 caused by rebound of the cleaning liquid L.

Here, the individual element techniques described in the first to third exemplary embodiments may be interchanged. For example, by applying the technique described in reference with FIGS. 10 and 12 to the processing unit 16 illustrated in FIG. 4 or the processing unit 16b illustrated in FIG. 13, the nozzle 41 may be retreated to the retreat position in the arm cleaning tank 23 which is not supplied with the cleaning liquid L, and when the cleaning is performed, the nozzle 41 cleaning mode and the processing liquid supply unit 400 cleaning mode may be switched by changing the height position of the liquid level of the cleaning liquid L. Further, by applying the technique described in reference with FIG. 16 to the processing unit 16 illustrated in FIG. 4 or the processing unit 16a illustrated in FIG. 8, the arm cleaning tank 23 may be always filled with the cleaning liquid L such that the whole of the processing liquid supply unit 400 (including the nozzle 41, the nozzle head 42, and the arm 43) are immersed in the cleaning liquid L at the retreat position.

Figure 13:
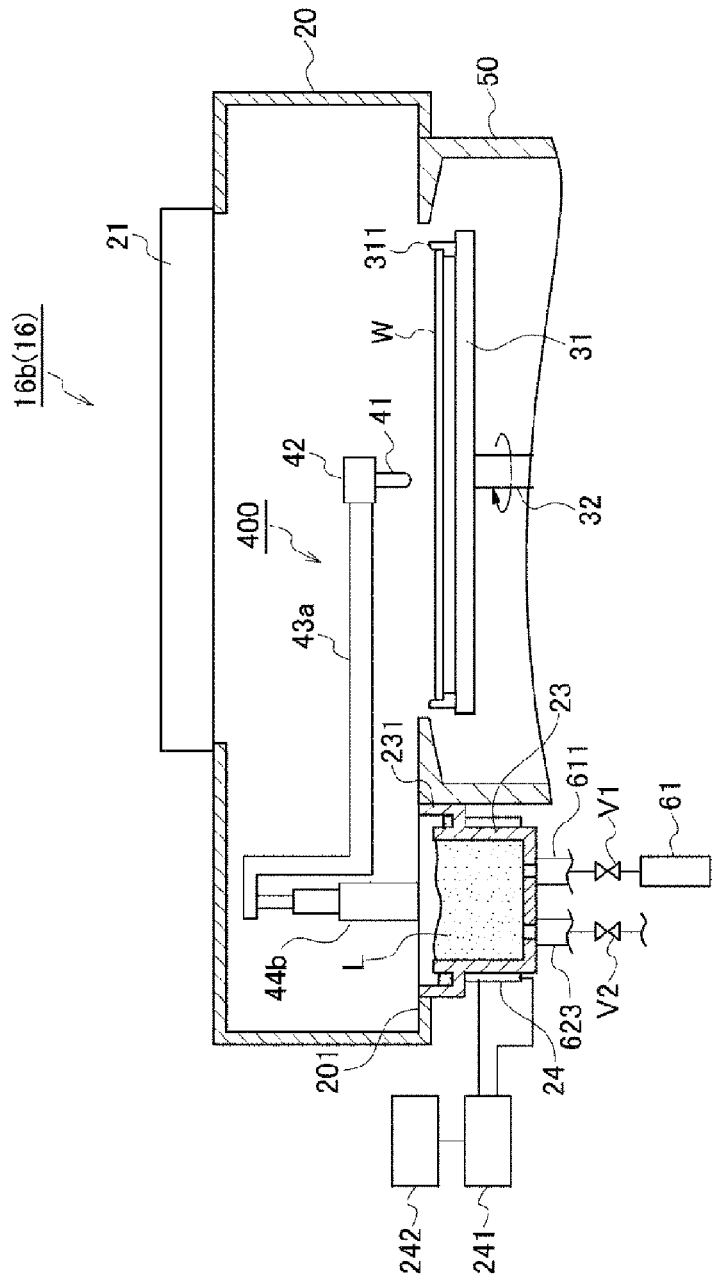
FIG. 13 is a vertical cross-sectional view illustrating a processing unit according to a third exemplary embodiment.
Figure 14:
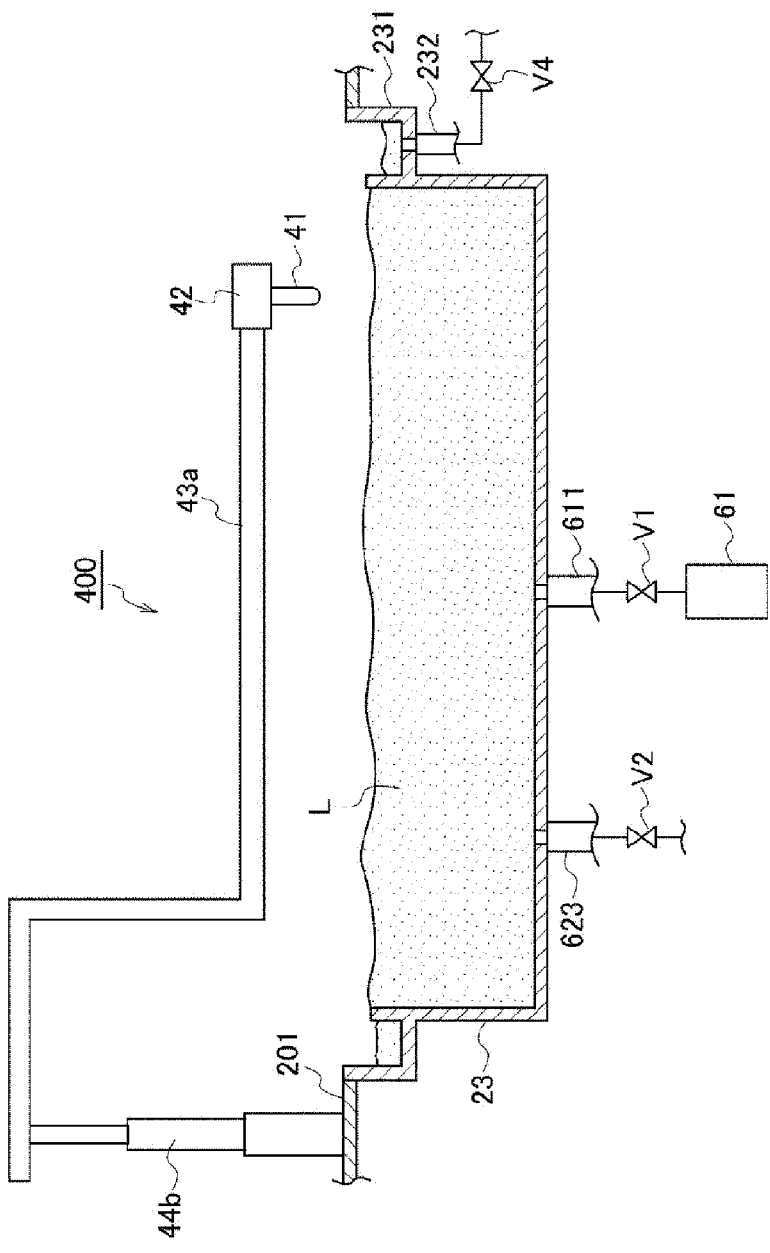
FIG. 14 is a vertical cross-sectional view illustrating a state where an arm is raised from the arm cleaning tank.
Figure 15:
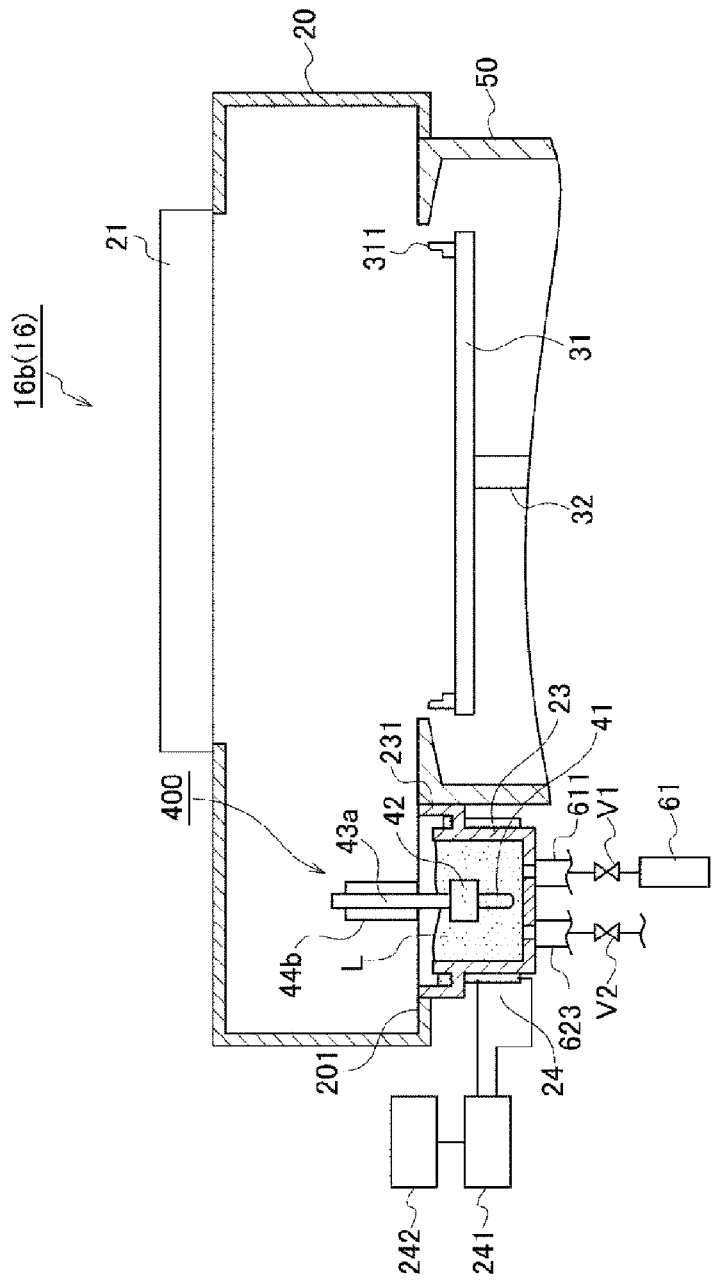
FIG. 15 is a vertical cross-sectional view illustrating the processing unit during the cleaning of a processing liquid supply unit.

Further, a short-time drainage using a plurality of discharge pipes 621 may be applied to the processing unit 16a illustrated in FIG. 8 or the processing unit 16b illustrated in FIG. 13. In the processing unit 16 illustrated in FIG. 4, drainage may be performed using a drain pipe 623 having a small diameter.

In addition, it is not necessary to provide the retreat position of the nozzle 41 inside the arm cleaning tank 23. For example, the retreat position of the nozzle 41 may be set above the opening of the arm cleaning tank 23, so that the nozzle 41 or the arm 43 is moved down into the vibration unit 24 only during the dummy dispense or when the processing liquid supply unit 400 is cleaned. Further, the liquid receiver 25 may be installed between the arm cleaning tank 23 and the processing position of the wafer W, and the installation position of the liquid receiver may be set as the retreat position.

Subsequently, a modified embodiment of the cleaning liquid will be described. In the cleaning of the processing liquid supply unit 400, the cleaning liquid supply unit 61 may be configured to supply, in addition to DIW described above, SC1 (a mixed aqueous solution of ammonia water and hydrogen peroxide) for removing organic contaminants or particles attached to the surface of the nozzle head 42 or arm 43, SC2 (a mixed solution of hydrochloric acid, hydrogen peroxide, and deionized water) for removing metal contaminants, and diluted hydrofluoric acid (DHF) for removing natural oxides on the surface of a metal member. Further, a switching mechanism may be provided to perform a cleaning with DIW after the cleaning with SC1, SC2, and DHF described above. Further, after the cleaning with the cleaning liquid, the cleaning liquid in the arm cleaning tank 23 may be replaced with a drying liquid, and then, the drying liquid in the arm cleaning tank 23 may be discharged, thereby facilitating drying of the nozzle head 42 or the arm 43. For example, after the cleaning with DIW, IPA may be used as the drying liquid. Further, after the cleaning with the cleaning liquid, a drying liquid layer may be formed on the upper surface of the cleaning liquid in the arm cleaning tank 23, and the cleaning liquid and the drying liquid in the arm cleaning tank 23 may be discharged, thereby facilitating the nozzle head 42 or the arm 43. The discharge speed of the cleaning liquid and the drying liquid at that time may be set such that the liquid level of the drying liquid gradually descends at a speed that liquid droplets are hard to stay. In this case, when a drying liquid supply unit for supplying into the arm cleaning tank 23 is provided above the arm 43 in the arm cleaning tank 23, the drying liquid layer may be easily formed on the upper surface of the cleaning liquid.

In addition, in order to suppress mist generated due to the application of ultrasonic waves from entering into the chamber 20, a cover may be provided to block the opening of the arm cleaning tank 23 during the cleaning of the processing liquid supply unit 400, or an air curtain may be formed across the opening. Further, it is not necessary to provide the vibration unit 24. The processing liquid supply unit 400 may be cleaned with a warm cleaning liquid, or the processing liquid supply unit 400 may be cleaned only by immersing it in a cleaning liquid at normal temperature.

As another example of the arrangement of the arm cleaning tank 23, the cleaning may be performed by immersing a plurality of processing liquid supply units 400 in a single arm cleaning tank 23. Further, the opening of the arm cleaning tank 23 may be configured to be flush with the bottom surface 201 of the chamber 20. Alternatively, for example, the arm cleaning tank 23 may be arranged on the bottom surface 201 such that the arm cleaning tank 23 is opened above the bottom surface 201.

Moreover, the configuration of the holding unit 31 or the processing liquid supply unit 400 is not limited to the exemplary embodiments described in reference to FIGS. 3 to 16. For example, there is known a processing unit including a nozzle 41 opened so as to face a wafer W held horizontally on a holding unit 31 that holds the wafer in a fixed state without rotating the wafer W and provided with a slit type ejection port having a diameter longer than that of the wafer W, and an arm 43 configured to hold the nozzle 41 in order to supply a processing liquid to the entire wafer W by moving the nozzle 41 from one end of the substrate to the other end thereof while ejecting a developer from the ejection port. The nozzle 41 and the arm 43 may be immersed in the arm cleaning tank 23 to perform a cleaning.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate liquid processing apparatus comprising:
a substrate holding unit configured to hold a substrate;
a processing liquid nozzle configured to supply a processing liquid to the substrate held by the substrate holding unit;
a nozzle arm configured to hold the processing liquid nozzle; and
an arm cleaning tank configured to immerse an entire surface of the nozzle arm in a cleaning liquid so as to clean the nozzle arm;
a chamber configured to accommodate the substrate holding unit, the processing liquid nozzle, the nozzle arm, and the arm cleaning tank;
a driving mechanism configured to drive the nozzle arm and arranged at a lateral side of the arm cleaning tank,
wherein the arm cleaning tank is provided in a bottom surface of the chamber to form a concave portion storing the cleaning liquid from an opening thereof toward a downward side, and
the nozzle arm includes a vertical bar portion that extends downwardly at a lateral side of a position where the nozzle arm is supported by the driving mechanism, and a horizontal bar portion that extends horizontally from a lower end of the vertical bar portion, and when the driving mechanism moves the nozzle arm down to a cleaning position, an entirety of the horizontal bar portion and the processing liquid nozzle are immersed in the cleaning liquid at the same time.

2. The substrate liquid processing apparatus of claim 1, wherein the arm cleaning tank includes:
a cleaning liquid supply unit configured to supply the cleaning liquid; and
a cleaning liquid discharge unit configured to discharge the cleaning liquid from the arm cleaning tank.

3. The substrate liquid processing apparatus of claim 1, wherein the nozzle arm is formed of a water-repellent material.

4. The substrate liquid processing apparatus of claim 1, further comprising:
a drying liquid supply unit configured to supply a drying liquid, which is more highly volatile than the cleaning liquid, to the arm cleaning tank.

5. The substrate liquid processing apparatus of claim 1, wherein the arm cleaning tank is provided with a vibration unit configured to apply ultrasonic vibration to the cleaning liquid in the arm cleaning tank.

6. The substrate liquid processing apparatus of claim 1, further comprising:
a temperature adjusting unit including a heater configured to adjust a temperature of the cleaning liquid.

7. The substrate liquid processing apparatus of claim 1, wherein a liquid receiver is provided inside the arm cleaning tank to receive the processing liquid ejected from the processing liquid nozzle and discharge the processing liquid to the outside.

8. The substrate liquid processing apparatus of claim 1, wherein a liquid receiver is provided in a bottom of the arm cleaning tank to receive the processing liquid ejected from the processing liquid nozzle and discharge the processing liquid to the outside.

9. The substrate liquid processing apparatus of claim 2, further comprising:
a driving mechanism configured to drive the nozzle arm,
wherein the driving mechanism has a function to move up/down the nozzle arm, or the cleaning liquid supply unit has a function to adjust a height position of a liquid level of the cleaning liquid in the arm cleaning tank, and
the apparatus further comprises a controller configured to supply a control signal for controlling a height position of the nozzle arm or a height position of the liquid level between a cleaning position where the nozzle arm is immersed and cleaned in the cleaning liquid and a position where only the processing liquid nozzle is immersed in the cleaning liquid, to the driving mechanism or the cleaning liquid supply unit.

10. The substrate liquid processing apparatus of claim 1, further comprising:
a cleaning liquid supply unit configured to continuously supply a cleaning liquid to the arm cleaning tank; and a drain groove installed to surround an upper end portion of the arm cleaning tank in a circumferential direction, and provided with a discharge port to receive a cleaning liquid overflowed from the arm cleaning tank and discharge the cleaning liquid.

11. The substrate liquid processing apparatus of claim 1, wherein a discharge tank is provided below the arm cleaning tank to accommodate the cleaning liquid discharged from the arm cleaning tank, and
the discharge tank has a capacity larger than that of the arm cleaning tank.

* * * * *